United States Patent
Lavin et al.

(10) Patent No.: US 8,073,288 B2
(45) Date of Patent: Dec. 6, 2011

(54) RENDERING A MASK USING COARSE MASK REPRESENTATION

(75) Inventors: Mark A. Lavin, Katonah, NY (US); Maharaj Mukherjee, Wappingers Falls, NY (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 995 days.

(21) Appl. No.: 12/015,084

(22) Filed: Jan. 16, 2008

(65) Prior Publication Data

US 2009/0180711 A1    Jul. 16, 2009

(51) Int. Cl.
G06K 9/20 (2006.01)
(52) U.S. Cl. ....... 382/283; 382/274; 382/275; 358/3.26; 358/3.27
(58) Field of Classification Search .................. 382/213, 382/274, 275, 283; 358/505, 517, 463, 474
See application file for complete search history.

(56) References Cited

U.S. PATENT DOCUMENTS

| | | | |
|---|---|---|---|
| 6,944,354 B2 * | 9/2005 | Groschup et al. | 382/275 |
| 6,945,928 B2 | 9/2005 | Kobayashi et al. | |
| 7,079,219 B2 * | 7/2006 | Kanno | 355/52 |
| 7,155,698 B1 | 12/2006 | Gennari | |
| 7,261,415 B2 * | 8/2007 | Chernyak | 351/209 |
| 7,433,017 B2 * | 10/2008 | Hirayanagi et al. | 355/53 |
| 7,458,683 B2 * | 12/2008 | Chernyak | 351/205 |
| 2005/0091631 A1 | 4/2005 | Gallatin et al. | |
| 2007/0022402 A1 | 1/2007 | Ye et al. | |
| 2007/0226677 A1 | 9/2007 | Gallatin et al. | |

OTHER PUBLICATIONS

Liu et al., "A New Polygon Based Algorithm for Filling Regions," Tamkang Journal of Science and Engineering, vol. 2, No. 4, 2000, pp. 175-186.
Search Report and Written Opinion US2009/030934.

* cited by examiner

*Primary Examiner* — Yosef Kassa
(74) *Attorney, Agent, or Firm* — Steven Capella; Hoffman Warnick LLC (57) ABSTRACT

A method, system and computer program product for rendering a mask are disclosed. A method of rendering a mask may comprise: providing an initial mask design for a photolithographic process, the initial mask design including polygons; initially rendering the initial mask design as a coarse mask representation in a pixel based image calculation; identifying an overhang portion; and rendering the overhang portion using a set of subpixels whose artifacts from spatial-localization lie outside a practical resolution of a pseudo lens having a numerical aperture larger than that of a projection lens used in the photolithographic process; and updating the initial rendering based on the overhang portion rendering.

25 Claims, 6 Drawing Sheets

RENDERING A MASK USING COARSE MASK REPRESENTATION

BACKGROUND OF THE DISCLOSURE

1. Technical Field

The disclosure relates generally to an integrated circuit (IC) fabrication, and more particularly to rendering a mask as a coarse mask representation.

2. Background Art

Considerable efforts have been made in the field of photolithography to develop and implement methods of mask compensation and verification. For example, one approach implements optical proximity corrections (OPC) based on pixel-based simulations (also known as dense-image simulations). A key aspect of this simulation approach is that the images of the projected mask patterns are calculated on a regular grid, rather than at a sparse set of isolated adjustment (or characterization) points. The regularity of pixel-based imaging enables fast Fourier transform (FFT) based computations (e.g. convolutions). FFT-based convolutions are relatively rapid compared to the classic convolution algorithms used in the earlier sparsely sampled mode of OPC, assuming that the earlier mode requires calculating the partially coherent images on a densely sampled basis. Fast convolutions typically involve both FFTs and inverse FFTs. Since a FFT and an inverse FFT are calculated in almost exactly the same way, the term "FFT" may be used herein to refer to both, unless specifically indicated otherwise. A FFT only allows modest reductions in the execution time when the output is not needed on a fully dense grid, e.g., via the "pruned FFTs". The above limitation applies both to reducing the density of the output grid and to situations where the density of the input grid needs to be increased.

Nevertheless, pixel-based imaging is still preferable for various reasons. For example, calculation of images on a dense grid enables more robust resist models in simulations, since the full exposure distribution in the neighborhood of each developed edge is available to the models as a complete and physically realistic input. Also, the regularity of pixel-based imaging is better suited to parallel computation than the sparse image sampling. This regularity provides predictability during an algorithm flow that a special-purpose computer infrastructure can optionally exploit to improve the efficiency of CPU utilization, e.g., by reducing memory latency. Another advantage of pixel-based image simulation is that it can take advantage of the bandlimited character of the image. Once the image has been computed on a grid of points with a step-size finer than the Nyquist spacing (e.g., $\lambda/[4*NA]$), the intensity at an off-grid point can then be calculated by the sinc interpolation. Here $\lambda$ is the wavelength used to form a lithographic image of the chip layer, and NA is the numerical aperture of the projection lens used to form the image. The relative coarseness of the Nyquist grid reduces the size of the FFTs that must be used to carry out the multiple SOCS (Sum-Of-Coherent Systems method) convolutions that are needed within each given mask block, making the FFTs for these repeated convolutions relatively fast. In SOCS convolutions, convolutions of the mask with each of multiple SOCS kernels, typically about 10 in number, are squared and summed to obtain a close approximation of a partially coherent image. The term "Nyquist spacing" refers to the well-known property of continuous bandlimited distributions that they can be fully specified by samples that are taken at a spacing of ½ the reciprocal of the bandlimit. In the context of image formation, an amplitude bandlimit is determined by the NA of the lens, and is more specifically NA/$\lambda$. The intensity bandlimit is twice the amplitude bandlimit. The Nyquist spacing as thus defined is the reciprocal of the intensity bandlimit. In pixel based simulations, a mask is processed in sections and the section is referred to as a "mask block."

In this description, the coarse initial grid on which intensity is calculated may be referred to as a Nyquist grid. However, it is appreciated that the step-size of a coarse initial grid may actually be chosen slightly smaller than the Nyquist limit for reasons of numerical stability, for example, to filter out weak residual content from unused SOCS kernels that may be present between the bandlimit of individual SOCS kernels and the bandlimit of the exact image. It should also be noted that while a coarse grid close to the Nyquist limit is very dense by the standards of conventional OPC, it is still very coarse compared to the precision required in a mask and a printed image.

The sizes of the FFTs used in pixel-based imaging (i.e., size of the mask block) are somewhat flexible. One factor that should be considered in making an efficient choice is the extended-range resolution of the projection lens, where an extended-range refers to the ability of a feature to have a weak influence on the image of another feature in the same region of the chip even when the two features are spaced sufficiently far apart to be separately resolved. Since two dimensional (2D) FFT algorithms exhibit a scaling with an area that is slightly worse than linear (by a log factor), one reasonable configuration for a pixel-based imaging carries out the SOCS imaging convolutions on blocks whose sizes are chosen to be only moderately larger than the buffer zones that must be included to accommodate the periodic boundary conditions. Periodic boundary conditions are an automatic consequence of using FFTs, and unless the mask features are truly periodic on the scale of the FFT, there will be distortions in the images of features whose distance from the period border is less than the extended-range of the lens resolution. Such features should preferably be considered to reside in a buffer zone whose image is not acceptably accurate. If the buffer zone is therefore subtracted from all sides of the image of one of these blocks (this buffer zone being chosen to be large enough to adequately encompass the tails of the lens impulse response), the remaining central "tile" of the block (chosen to be of similar dimension to the buffer zone in this configuration) represents the unit into which the patterns are divided. The size of the buffer zone is then chosen to be a moderately large multiple such as 10 or 20 of the conventional lens resolution (i.e., a multiple of the minimum resolvable feature separation), whereas the Nyquist step size will be a moderately small fraction of the minimum resolvable feature separation (no larger than 0.25$\lambda$/NA). For efficiency, the size of the central tile of the block that remains after trimming the buffer zone should not be dramatically larger than the buffer zone, otherwise the nonlinear scaling of FFT calculation time will degrade efficiency. For these reasons, the Nyquist limit and the extended-range lens resolution together imply that the FFT size should preferably be fairly large, for example in the range of $128^2$ to $1024^2$. Because the log-like departure in the scaling of FFT algorithms from pure area-proportionality is fairly weak, the exact choice is not critical from this point of view.

Computer hardware architecture can also influence the choice of FFT size. Chips or other hardware that are specialized for FFT computations may be particularly efficient in handling FFTs of a particular size, such as 1024×1024 ($1K^2$), or may be efficient at handling FFTs in a particular range of sizes.

Two-dimensional FFTs operate on a discrete array of numbers as the input. When an FFT is taken for a portion of a lithographic mask (to use in a pixel-based image simulation), the input array is essentially a bitmap representation of the amplitude transmission of that portion of the lithographic mask.

Ordinarily, each feature on the physical mask is polygonal with right-angle corners (so-called Manhattan polygons). The rare polygons that are nominally non-Manhattan are often fabricated as Manhattan by the mask-writing tools, and in any case non-Manhattan polygons are sufficiently rare in integrated circuits that a method which significantly speeds the lithographic simulation of pure-Manhattan polygons will significantly speed the lithographic simulation of entire chip levels. In the simplest representation of the mask design, each polygon has a specified uniform amplitude transmission, such as 100%. Here amplitude transmission ('transmission' for short) refers to the relative amplitude of the electric field transmitted through a particular point on the exit face of the mask.

The transmission is most often a real number, but may also be a complex number, in cases where the phase of the mask transmission is different from 0° or 180°. However, for purposes of discussion, the mask transmission can always be considered to be 100% inside the polygons, and 0% outside, since other transmission cases can be converted to this form by scaling. Note that an FFT uses discrete arrays as inputs, whereas each pixel in the mask bitmap can be considered as representing a small but finite square region of the mask.

The output of an FFT is also a discrete array of numbers. As noted above, the assumption of discrete Fourier orders in the pupil amounts to an assumption that the mask is periodic. The latter assumption can safely be made even with non-periodic masks, e.g., by employing a buffer zone around the actual working region where the OPC or the verification is implemented.

The use of a discrete array of numbers as an input to the FFT amounts to an assumption of discrete impulse apertures on the mask, whereas the true polygonal mask openings are continuous. In effect, the FFT therefore treats each mask polygon as a sampled array of dots (delta-functions) that fill the polygon's footprint. This bed-of-nails representation of polygons would not be particularly accurate (at reasonable sampling densities) if used in isolation. However, if such a delta-function array is convolved with a small square pixel of a size that matches the delta-function spacing, the original continuous polygon can be accurately recovered. More precisely, the original continuous polygons will be recovered if the polygon edges are laid out on the same grid as the dot array (with the polygon grid offset by half a step in each axis). In the pupil domain, such a convolution is equivalent to multiplying the discrete FFT of the delta-function array by a sine cardinal (sinc) filter. As such, through a simple filtering step, the transform of the continuous mask can be accurately calculated with the (relative) efficiency of discrete FFTs. Note that this sinc filter may be folded into the optical SOCS kernels, either as an explicit step, or inherently when these SOCS kernels are calculated. However, it is required that the size of the Manhattan mask polygon across each of its horizontal and vertical dimensions must be an integer multiple of the FFT grid step size for this method to work, which as discussed further herein, will usually not be the case.

Another aspect of the mask behavior that must be taken into account in the state-of-the-art lithographic simulations is the three-dimensional character of the physical mask structure. For example, mask polygons are typically fabricated as polygon-shaped openings in a film of, for example, opaque chrome that has been deposited on a transparent substrate. The film is typically thin, for example only a few 10's of nanometers in thickness, but such a thickness can no longer be considered infinitesimal when the widths of the polygonal openings in the film are as small as, for example, 200 nm. Note that the image of the polygonal features is usually demagnified by a factor of, e.g., 4, when the illuminated mask pattern is projected onto the semiconductor wafer. The imaging theory that underlies conventional algorithms for lithographic simulation was originally developed for masks that could be approximated as ideal transmission screens ("thin masks"). Representation of a lithographic mask by a transmission bitmap would ordinarily reflect this approximation, where 3D mask topography is neglected when a 2D bitmap is used. The impact of finite mask topography on the lithographic image is referred to as "EMF effects".

It is no longer entirely adequate to neglect mask topography in the state-of-the-art lithography, where EMF effects represent a perturbation on ideal thin-mask behavior that is small but often non-negligible. Deviations of the transmitted field from the ideal thin-mask behavior are largely localized to the edges of features (assuming standard 4× magnified masks). It is generally adequate for purposes of OPC to represent this perturbation as a simple adjustment to the thin mask behavior that is constant (for a particular illuminating polarization). In other words, one may apply a certain adjustment to the thin-mask patterns in order to approximate the EMF effect. This adjustment needs not vary along the edge of an aperture, nor between different aperture edges, as long as the edges represent the same kind of discontinuities in the film stack topography, and they share a common orientation relative to the illumination polarization.

Most often this EMF adjustment is simply a fixed bias, i.e., EMF effects are treated for simulation purposes as a small "outward" offset in the effective positions of edges (where "outward" might refer to a uniform expansion of opaque features). For more accurate calculations, Tirapu-Azpiroz has shown that EMF edge perturbations can be approximated as small strip-like features of essentially fixed transmission (generally a complex transmission) that are assumed for simulation purposes to lie along the aperture boundaries (i.e., along the polygon edges). These boundary layers are artificial polygons of very narrow width that are added to the set of circuit design polygons in order to imitate EMF effects. Since these perturbing strips (known as boundary layers) are considerably narrower than the lens resolution, their width can (in first approximation) be modestly re-adjusted as long as a compensating adjustment is made in the transmission, holding the width-transmission product effectively constant. This must be qualified as "effectively" constant because the width-transmission product is required to include the thin-mask transmission that would otherwise have been present in the strip of mask area that the boundary layer nominally displaces. Typically the width of the boundary layer is only of the order of 10 nanometers or less (in 1× units) when its transmission is assigned a magnitude value close to 1.

Thus, current methods can represent the effect of 3D mask topography, but they do so with either a non-negligible level of approximation (bias model), or with a substantial increase in the number of features (boundary layer model), with the added features having widths that are typically smaller than $0.1\lambda/NA$. The boundary layers are positioned precisely along the edges of the polygonal features, which may also be given a small bias (e.g., biased outwards slightly) as part of the process of accounting for EMF effects.

Unfortunately, the high density of the design gridding used in almost all IC masks poses a computational difficulty for the pixel-based simulation approaches. Circuit and OPC requirements typically dictate that the edges of mask features be defined on a very fine grid, e.g., of order 0.01 times the width of the smallest feature (as a rough rule of thumb). The minimum feature size is typically about 0.35*wavelength/NA, which makes a polygon design grid much finer than the Nyquist grid (coarse grid). A fine grid is also required to accommodate the narrow precisely positioned boundary layers that may be included in the design to account for EMF effects.

It is the precision at which edges are positioned on the mask that poses a significant difficulty for pixel-based imaging. It is completely impractical to calculate the SOCS image on a grid as fine as the design grid, which is of the order of 50 times finer than the Nyquist grid along each axis in a typical case. As a result, the calculated images are inaccurate. The resist and process models used in OPC to calculate the positions of printed feature edges often use as an input the calculated optical image in an extended neighborhood around the printed edge. Error propagation then causes an increased error in the predicted position of the printed edge. Even when this error is within the overall tolerance level allowed for prediction errors, it can still be of concern in an OPC. One reason is that different instances of a particular feature will usually be placed differently against the fixed pixel grid. This will cause the overhang conditions at a polygonal feature's edges to vary from instance to instance, resulting in variations in rendering errors. As a consequence, invalid variations may exist in the OPCs assigned to different occurrences of the feature. Often the tolerance on the variations in the printing of a particular feature is more stringent than the tolerance on the mean OPC for the feature. As a result, it is important that OPC not be sensitive to the exact positioning of a mask feature against any grid (other than the design grid).

Since a calculation on the very fine design grid is completely impractical, present approaches instead attempt to make the rendered mask resemble the true mask as closely as possible. It is known in the art that one may reasonably go so far as to subdivide the Nyquist grid by a more modest factor, such as 4, even when the 50× subdivision that would fully represents the design grid is not practical. By making the sampling 4× finer than the Nyquist, the rendered mask is made to more closely resemble the true mask. This reduces the error that results from ignoring structure on the design-grid level, though it does not eliminate the error. In combination with the known technique of transmission-matched subpixels, this conventional approach achieves an accuracy that is considered marginally acceptable, in the absence of better alternatives. Likewise, while subdivision of the Nyquist grid by 4 times in each axis will significantly increase processing time, such an increase is usually deemed acceptable, in the absence of better alternatives. The process of subdividing the Nyquist grid is known as "subsampling"; the subdivided grid will be referred to herein as the "sub-Nyquist grid"; and the individual elements of the sub-Nyquist grid will be referred to herein as "subpixels."

The technique of transmission-matched subpixels is also used in the conventional approaches to make the rendered mask resemble the true mask down to the finest scale available (i.e., at a subpixel scale). Specifically, the rendered mask is made to resemble the true mask as closely as possible at the subpixel level by assigning a gray-level transmission to subpixels whose area is partly covered by polygons. This gray-level transmission (also referred to as a gray-level density) is equal to the fraction of the subpixel area that is covered by polygons. The overall transmission of the subpixel is matched to that of the true mask, but this transmission-matching (also referred to as density-matching) cannot be achieved at a finer than subpixel scale. Transmission-matching has the effect of preserving the area of a polygon, in a weighted sense, when the polygon is converted to bitmap subpixels in a transmission map. Here weighting means that when a subpixel is given a grey-level transmission to represent its partial coverage by the polygon, the weighted area of the subpixel is considered to be reduced in proportion to the grey-level transmission value. However, if this weighting is neglected, the area of all subpixels that are at least partly covered by the polygon will be slightly larger than the polygon's true area, an indication that the representation is slightly distorted.

A difficulty of this conventional method is that the region where the rendered mask departs from the true mask is sharply bounded by the subpixel boundaries. This sharp bounding of each gray-level region results in the generation of spurious high frequencies. These high frequencies turn out to cause errors even though they are mostly outside the collection band of the projection lens. Errors arise because the Fourier transform of a mask rendering that has been gridded at the sub-Nyquist sampling rate is mathematically equivalent to a convolution of the true diffracted spectrum with a broadly spaced comb function, thereby superimposing periodic repeats of the spatial frequency spectrum (diffraction pattern). This spectrum will not be bandlimited. The hard edges of polygonal mask features imply an infinite bandwidth, as do the sharp boundaries between adjacent subpixels, which means that neither the spectrum of the sampling grid nor the spectrum of the true mask will be bandlimited. High frequencies in the sampling grid can interfere with (i.e., couple to) high frequencies in the diffraction pattern of the true mask, which produces low frequency artifacts (errors) that are collected by the lens. Gridding at the subsampling/sub-Nyquist rate rather than at the Nyquist rate serves to more fully separate the overlapping virtual repeats of the diffracted spectrum, and therefore to reduce these artifacts. However, gridding at the subsampling/sub-Nyquist rate does not eliminate these artifacts since the very high subsampling needed to fully match the high frequency design grid is impractical. As noted, a subsampling factor of 4× (in each axis) is typical in the conventional approaches. Note that while 4× subsampling achieves an accuracy that is only marginally accurate even in combination with transmission-matching of subpixels, it nonetheless entails a significant penalty in computation time. For example, if the inverse FFTs used to compute each SOCS convolution are 1K×1K, the FFT used to calculate the collected mask spatial frequencies will be 4K×4K after 4× subsampling. This will require about 20× longer calculation time with standard FFT algorithms than each 1K×1K inverse FFT for SOCS.

As such, high frequency suppression (used for treating interfering high frequency) will be incomplete because the density-matching takes place within a spatially bounded subpixel. In addition, complete suppression requires that the rendition extends across the full mask block under consideration (e.g., of size $1024^2$ before subsampling), or at least across a block of subpixels that is significantly larger than the lens resolution, which would entail significant computational overhead, since many neighboring subpixels would need to be adjusted to render the overlapping subpixels.

The high density of the subsampled grid therefore makes a Fourier transformation the most time-consuming step in the state-of-the-art pixel-based image simulation of a mask, despite the speed advantages provided by FFTs.

An alternative proposal for circumventing the unfavorable accuracy/speed tradeoff in direct mask Fourier transformation is to use the traditional sparse-imaging method of corner-based or edge-based table-lookup for manipulating polygonal mask features. One can consider using the same kind of table-lookup algorithm to calculate the limited set of mask spatial frequencies that are captured by the projection lens. Typically, the polygon convolutions that are stored as tables of pre-convolved corners in today's sparse-imaging routines involve about at least one such table for each of the ten or so SOCS kernels used. Unfortunately, the Fourier transforms used in dense imaging might still require a much more substantial memory access overhead, since the Fourier transforms used in dense imaging would typically involve between, e.g., $128^2$ to $1024^2$ orders, depending on the block size chosen, and most of these would fall within the circular support of the imaging kernels in the case where the pupil fill σ approaches 1. As a consequence, at least one table is required for each of the $128^2$ to $1024^2$ Fourier orders.

In sum, while the present methods of rendering a mask make a reasonably balanced compromise between accuracy and speed, the final result is only marginally acceptable by either criterion.

SUMMARY OF THE DISCLOSURE

The first aspect of the disclosure provides a method of rendering a mask, the method comprising: providing an initial mask design for a photolithographic process, the initial mask design including polygons; initially rendering the initial mask design as a coarse mask representation in a pixel based image calculation using a computer; identifying an overhang portion using the computer; rendering the overhang portion using a set of subpixels whose artifacts from spatial-localization lie outside a practical resolution of a pseudo lens having a numerical aperture larger than that of a projection lens used in the photolithographic process using the computer; and updating the initial rendering based on the overhang portion rendering using the computer.

The second aspect of the disclosure provides a system for rendering a mask, the system comprising: a computer configured to perform the method comprising: receiving an initial mask design for a photolithographic process, the initial mask design including polygons; initially rendering the initial mask design as a coarse mask representation in a pixel based image calculation; identifying an overhang portion; rendering the overhang portion using a set of subpixels whose artifacts from spatial-localization lie outside a practical resolution of a pseudo lens having a numerical aperture larger than that of a projection lens used in the photolithographic process; and updating the initial rendering based on the overhang portion rendering.

A third aspect of the disclosure provides a computer program product for rendering a mask, comprising computer usable program code embodied on a non-transitory computer readable medium which, when executed by a computer system, enables the computer system to: receive an initial mask design for a photolithographic process, the initial mask design including polygons; initially render the initial mask design as a coarse mask representation in a pixel based image calculation; identify an overhang portion; render the overhang portion using a set of subpixels whose artifacts from spatial-localization lie outside a practical resolution of a pseudo lens having a numerical aperture larger than that of a projection lens used in the photolithographic process; and update the initial rendering based on the overhang portion rendering.

A fourth aspect of the disclosure provides a method of providing a system for rendering a mask, the method comprising: a computer infrastructure operable to: receive an initial mask design for a photolithographic process, the initial mask design including polygons; initially render the initial mask design as a coarse mask representation in a pixel based image calculation; identify an overhang portion; render the overhang portion using a set of subpixels whose artifacts from spatial-localization lie outside a practical resolution of a pseudo lens having a numerical aperture larger than that of a projection lens used in the photolithographic process; and update the initial rendering based on the overhang portion rendering.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The description includes the following headings for illustrative purposes only: I. Introduction and Definitions, II. System Overview, III. Operational Methodology, and IV. Conclusion.

I. INTRODUCTION AND DEFINITIONS

Figure 1:
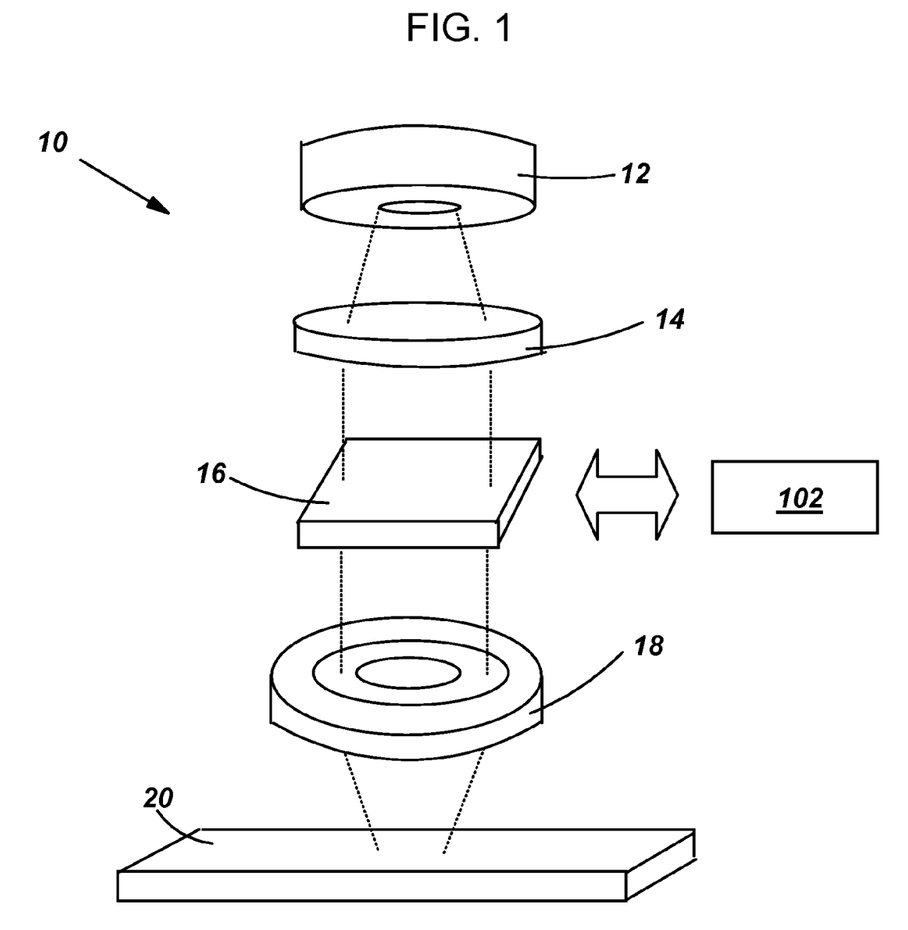
FIG. 1 shows an illustrative environment for simulating a mask used in a photolithographic process.

The current disclosure is based on, among others, an understanding that an image produced by a projection lens may be affected by the impulse response of the projection lens and the mutual coherence function of the illumination. It can be achieved that a simulated image of the mask matches an actual image produced by the projection lens without modeling the mask by representing the fine-structure of the mask. Specifically, rather than attempting to reproduce the fine-structure of a mask as accurately as possible in a simulation, the current disclosure constructs a coarse representation of the mask that has approximately the same Fourier transforms (FT) as the mask if both are bandlimited by the impulse response of a pseudo lens with a numerical aperture larger than that of the projection lens. According to an embodiment, the pseudo lens has a numeral aperture twice of the numerical aperture of the projection lens actually employed in the photolithographic process. More generally, the pseudo lens may have a numeral aperture approximately (1+σ) times the numerical aperture (NA) of the projection lens. Here symbol σ represents the half directional range of the illumination used in the photolithographic process, expressed as a fraction of the NA. In most cases, the illumination will include no dark-field component such that (1+σ) will be less than 2. It should be appreciated that the pseudo lens may be any band-limiting function, e.g., the dominant SOCS kernels of projection lens 18, as shown in FIG. 1, and all are included in the disclosure. It should also be appreciated that the numerical aperture of the pseudo lens may only be used in the simulation process and is not necessarily involved in any actual filtering/bandlimiting process. That is, while the disclosure may construct a coarse representation of a mask that has approximately the same FT as the mask after both are bandlimited by the pseudo lens, such a bandlimiting process does not necessarily need to be performed to construct the coarse mask representation. After it is constructed, the coarse mask representation would generally be used in lithographic simulations which essentially involve only a limited portion of the spatial frequencies contained in the coarse representation. The bandlimit of this portion of relevant spatial frequencies must be smaller than or equal to the bandlimit of the pseudo lens used to construct the coarse mask representation. As such, regardless of whether a direct frequency filtering of the coarse mask representation is explicitly conducted, a bandlimit function can be identified that defines a test that the coarse mask representation must pass.

As will be described herein, the current disclosure works preferably under the condition that the rendering of a polygon fragment of the mask be confined to an area that is not appreciably larger than the lens resolution of the projection lens in order that the rendering be computationally efficient.

In the current description, terms are defined as follows.

A "sub-Nyquist grid" refers to a sampled representation of a mask that is defined on a moderately finer grid than the Nyquist sampling grid, e.g., 2-4 times finer in each axis.

A "Nyquist spacing" refers to the property of continuous bandlimited distributions which can be fully specified by samples that are taken at a spacing of ½ the reciprocal of the bandlimit. In the context of image formation, the amplitude bandlimit is determined by the lens NA, and is more specifically NA/λ. λ is the wavelength used to form the lithographic image of the chip level, and NA is the numerical aperture of the projection lens that forms the image. An intensity bandlimit is twice the amplitude bandlimit. The Nyquist spacing as so defined is the reciprocal of the intensity bandlimit. The Nyquist spacing is generally provided as approximately λ/[4*NA]. However, sometimes in the field of lithographic simulations, the term Nyquist spacing is used informally to describe a spacing for the SOCS convolutions that is a bit finer than the above formula, such as λ/[5*NA]. This slightly increased sampling density is used to ensure stability in interpolating the intensity.

A "sub-sampling" of a mask refers to a sampling with a spacing smaller than the general Nyquist spacing. Specifically, for example, a sub-sampled mask representation is defined on a grid that is 2 times or 4 times finer than the grid used for SOCS convolutions. This finer grid will be referred to as a sub-Nyquist grid.

A "sub-Nyquist Bitmap" refers to a Bitmap transmission mask defined on the sub-Nyquist grid.

A "Nyquist grid" refers to a coarse initial grid having a step size of approximately λ/[4*NA], i.e., the Nyquist spacing. However, it is appreciated that the step-size of a coarse initial grid may actually be chosen slightly smaller than the Nyquist limit for reasons of numerical stability.

A "k1" unit refers to a dimensionless scaling of image-plane distances commonly employed in the field of semiconductor lithography. One k1 unit equals the physical distance of λ/NA.

A "covered pixel" refers to a pixel that lies entirely inside a portion of the mask represented by a polygon. If a portion but not all of the pixel lies inside the polygon, the pixel is referred to as a "partially covered pixel". These terms are similarly applied to the subpixels in a sub-Nyquist Bitmap.

A "polygon fragment" refers to a portion of a polygonal mask feature which cannot be exactly represented by pixels in a bitmap representation of the mask. That is, each portion of a polygon that lies on a partially covered pixel is referred to as a polygon fragment. Bitmap pixels that are entirely covered by a polygon can be accurately represented by a single transmission value, as can bitmap pixels which are not covered at all by any polygon.

"Maximum pupil fill", or "pupil fill", denoted with the symbol σ, is a measure of the directional spread of an illumination source. More specifically, σ is defined as the sine of the maximum angle of the incidence of the illuminating light onto the lithographic mask in normalized units where the numerical aperture of the projection lens is scaled to 1 at the mask.

"Rendition" of a polygon refers to an entry in a Nyquist/subNyquist bitmap that is intended to represent the polygon's presence on the mask.

"NA" refers to the numerical aperture of a projection lens used in a photolithographic process, unless specified otherwise.

An "overhang portion" refers to a portion in a mask representation that lies on a partially covered pixel. An overhang portion may include a polygon fragment and/or an edge field positioned adjacent the polygon fragment.

An "edge field" includes a boundary layer and/or a Domain Decomposition Method (DDM) field.

II. SYSTEM OVERVIEW

Turning to the drawings, FIG. 1 shows an illustrative environment 10 for simulating a mask used in a photolithographic process. Environment 10 is used to projects a mask image onto a wafer 20. To this extent, environment 10 may include an illumination source 12, a condenser lens system 14, a mask/initial mask 16, a projection lens (system) 18 and a wafer 20. Projection lens 18 projects light over a range of angles that is characterized by the numeral aperture (NA); more specifically, the NA specifies the product of the sine of the half-angular range over which the light projects onto wafer 20 and the refractive index of the medium between lens 18 and wafer 20. Mask 16 may initially be developed in the form of an initial mask design such that in a photolithographic process, the initial mask design for mask 16 needs to be simulated and adjusted/compensated to produce the final design for mask 16. In the description herein, a mask may also refer to a mask design instead of a real mask used in a lithographic process. A computer infrastructure 102 is coupled to mask 16 to implement, among other, the mask simulation/adjusting/compensation processes, and specifically may perform the various processes described herein to simulate mask 16.

Figure 2:
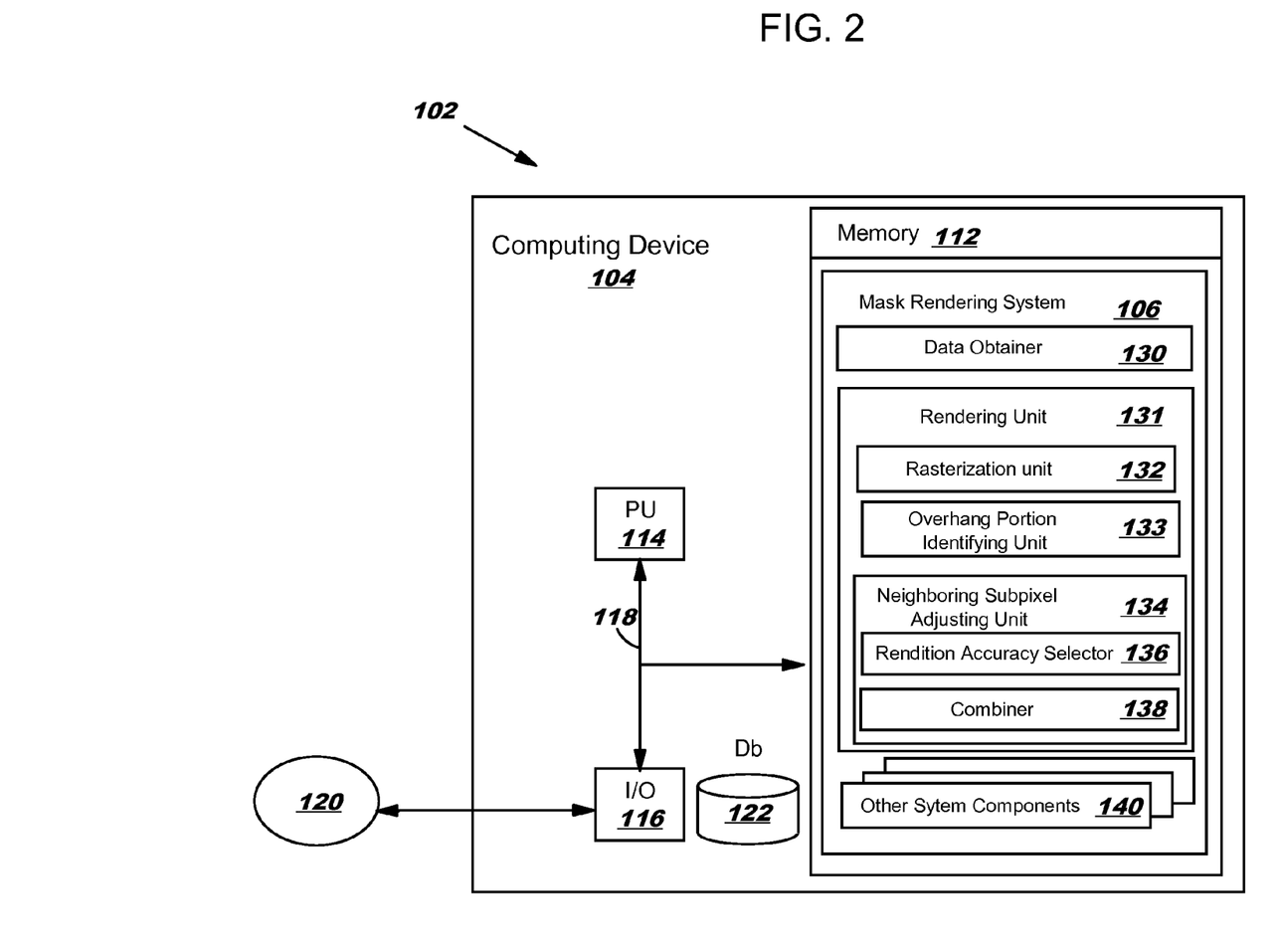
FIG. 2 shows a block diagram of an embodiment of a computer infrastructure.

Turning to FIG. 2, a block diagram of an embodiment of computer infrastructure 102 is shown. Computer infrastructure 102 may include a computing device 104 that comprises a mask rendering system 106, which enables computing device 104 to simulate a mask, e.g., mask 16 (FIG. 1), by performing the processes described herein.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as mask rendering system 106, that is stored in memory 112 and/or storage system 122. While executing computer program code, processor 114 can read and/or write data, such as mask 16 (FIG. 1) design information, to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices.

In any event, computing device 104 can comprise any general purpose computing article of manufacture capable of executing computer program code installed by a user (e.g., a personal computer, server, handheld device, etc.). However, it is understood that computing device 104 and mask rendering system 106 are only representative of various possible equivalent computing devices that may perform the various processes of the disclosure. To this extent, in other embodiments, computing device 104 can comprise any specific purpose computing article of manufacture comprising specialized hardware and/or computer program code for performing specific functions, any computing article of manufacture that comprises a combination of specific purpose and general purpose hardware/software, or the like. For example, computing device 104 may include a cell processor. In each case, the program code and hardware can be created using standard programming and engineering techniques, respectively.

Similarly, computer infrastructure 102 is only illustrative of various types of computer infrastructures for implementing the disclosure. For example, in an embodiment, computer infrastructure 102 comprises two or more computing devices 104 (e.g., a server cluster) that communicate over any type of wired and/or wireless communications link, such as a network, a shared memory, or the like, to perform the various processes of the disclosure. When the communications link comprises a network, the network can comprise any combination of one or more types of networks (e.g., the Internet, a wide area network, a local area network, a virtual private network, etc.). Regardless, communications between the computing devices may utilize any combination of various types of transmission techniques.

As previously mentioned and discussed further below, mask rendering system 106 enables computing infrastructure 102 to simulate an image on a wafer produced through a mask. To this extent, mask rendering system 106 is shown including a data obtainer 130; a rendering unit 131 including a rasterization unit 132, an overhang portion identifying portion 133 and a neighboring subpixel adjusting unit 134; and other system components 140. Neighboring subpixel adjusting unit 134 further includes a rendition accuracy selector 136 and a combiner 138. Other system components 140 may include peripheral functions not expressly described herein, but essential to simulation system 106 operations. Operation of each of these components is discussed further below. However, it is understood that some of the various components shown in FIG. 2 can be implemented independently, combined, and/or stored in memory for one or more separate computing devices that are included in computer infrastructure 102. Further, it is understood that some of the components and/or functionality may not be implemented, or additional systems and/or functionality may be included as part of computer infrastructure 102.

III. OPERATIONAL METHODOLOGY

Figure 3:
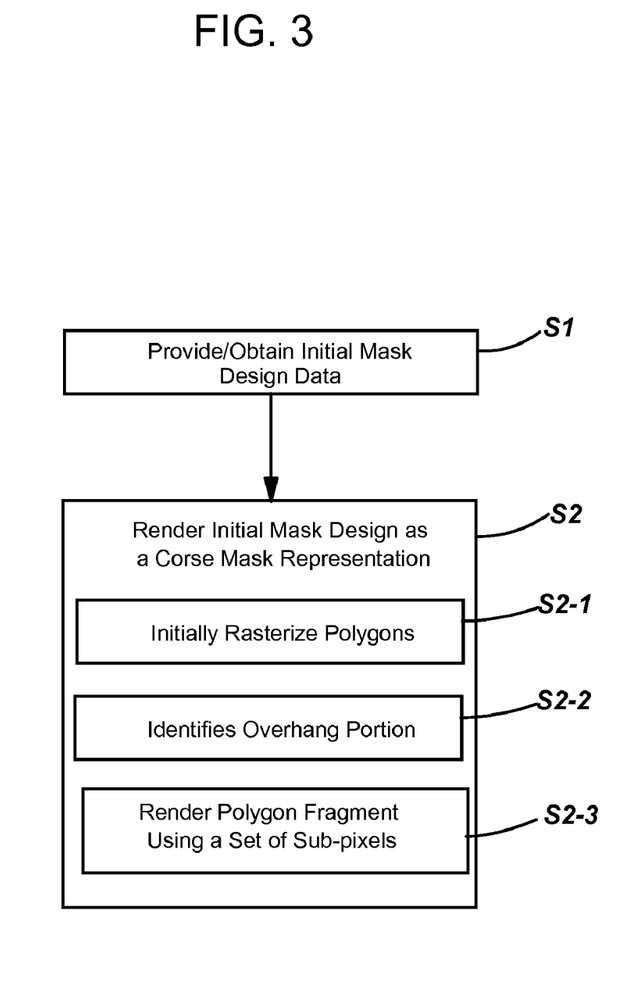
FIG. 3 shows a flow diagram of embodiments of an operational methodology of a mask rendering system.

Referring to FIG. 3, an embodiment of an operational methodology will be described in conjunction with FIG. 2. It is understood that while a particular order of functions has been illustrated, the order may be altered from that shown.

In process S1, data obtainer 130 obtains a provided initial designed mask 16 (hereinafter "initial mask design") (FIG. 1) to be operated on/with. According to an embodiment, the initial mask design may include/be represented by polygonal features ("polygon"). The initial mask 16 design data may be obtained in any now known or later developed fashion and all are included in the disclosure. For example, they may be input by a user, retrieved from a database, or calculated based on other data, etc.

In process S2, rendering unit 131 renders initial mask design 16 with a coarse mask representation. Process S2 may include multiple sub-processes. In S2-1, rasterization unit 132 initially renders the initial mask of polygonal features into a pixel based image in a sub-Nyquist bitmap. As will be appreciated, polygon fragments may result in the initial rasterization. In the following description, a polygon refers to a polygonal feature other than a polygon fragment for descriptive purposes. It is appreciated that any method may be used in the initial rasterization, and all are included in the disclosure. It should also be appreciated that it is not necessary for the whole mask to be rendered; rasterization unit 132 may choose to render a particular mask-domain block of the initial mask for which an optical proximity correction (OPC) is being carried out. As the initial rendition will be adjusted/updated later, efficiency in the computation of the Fourier transform may be achieved by using an efficient/fast transforming method. For example, the initial rendition may be calculated with a consideration that a FFT will be performed on the rasterized image. It should be appreciated that although a transform process is considered in the simulation processes described herein, an actual transform may not need to be conducted. The accuracy for a FFT will be generally satisfactory regarding the subpixels that are totally covered by polygons or totally not covered by polygons. The FFT of a polygon or a polygon portion that exactly covers the subpixels it falls upon can be calculated from the FFT of a discrete array of subpixel transmission values by means of a simple sinc filter calculated as the FFT of a single subpixel square. However, the FFT of the subpixel partially covered by a polygon fragment may not be satisfactory.

In S2-2, overhang portion identifying unit 133 identifies an overhang portion. An overhang portion may include a polygon fragment and/or an edge field.

In S2-3, neighboring subpixel adjusting unit 134 renders an overhang portion using a set of subpixels whose artifacts from spatial-localization lie outside of a practical resolution of a pseudo lens having a numeral aperture larger than that of projection lens 18 used in the photolithography process. In the description herein, the rendering of an overhang portion will be first described with respect to a polygon fragment for illustrative purposes, and the rendering of other types of overhang portions, e.g., a boundary layer, will be further described based on the description of the polygon fragment rendition.

As is appreciated, an FFT requires data for its input that are laid out on a regular grid. Since polygon fragments can only be accurately captured on a grid that is too fine for practical use, the accuracy of the FFT regarding a polygon fragment will generally be unsatisfactory. Accuracy may be improved if the subsampling is increased to, for example, 4 times, but the processing time will increase by a worse-than-linear factor, e.g., by more than 16 times for 2D FFT inputs. In the current disclosure, rendition of polygon fragments on to, e.g., the Nyquist bitmap, will be carried out using a new method (s), as will be described herein.

According to an embodiment, as a result of the initial rasterization, a polygon fragment may be identified. The polygon fragment is further rendered by adjusting a set of subpixels whose artifacts from spatial-localization lie outside of a practical resolution of a pseudo lens having a numeral aperture larger than that of the projection lens used in the photolithography process. For example, the pseudo lens has a numeral aperture approximately $(1+\sigma)$ times the numerical aperture of the projection lens, $\sigma$ being expressed as a fraction of the NA of projection lens 18 (FIG. 1). For a specific example, the pseudo lens may have a numeral aperture approximately twice of that of projection lens 18 (FIG. 1).

According to an embodiment, the set of subpixels are positioned about the polygon fragment with a radius of approximately at least two subpixels. The set of subpixels covers a region centered at a subpixel partially covered by the polygon fragment. For illustrative purposes, the region covered by the subpixels may also be referred to as a patch for simplicity purposes. To reduce computation overhead, the patch needs to be as small as possible, provided that a required accuracy of transformation is met. The accuracy is impacted by the size of the patch because a patch that is restricted to a small size means increased high frequency artifact content, some of which will be converted into errors in the collected low frequencies due to the coarse sub-Nyquist sampling. In a simple embodiment, a patch size, preferably in the full Nyquist bitmap, is only reduced by a moderate factor from the size of the entire block being processed. For example, if the full block size is between 25 and 200 K1 units, the patch size might be 12 K1 units. It is appreciated that an initial rasterization of the polygon fragment is not necessary. That is, if a polygon fragment can be identified without the initial rasterization, the rendition of the polygon fragment may be determined without the initial rasterization in process S2-1, as will be described herein.

According to an embodiment, neighboring subpixel adjusting unit 134 determines the rendition of a polygon fragment by adjusting the initially rendered subpixels in the patch. The adjustment may be implemented according to the following embodiments.

According to a first embodiment, neighboring subpixel adjusting unit 134 adjusts the subpixels in the patch by performing an analytic Fourier transform and a backtransform with a narrow buffer around the subpixels within the patch. Theoretically, a finite additional error (beyond that from the assumed periodic boundary conditions, which is dealt with by a buffer) will always be introduced when the polygon-fragment's contribution is restricted to a region smaller than the full mask block, e.g., $1024^2$, since the impulse response of the pseudo lens (e.g., of 2*NA) is unbounded. However, the polygon-fragment's total contribution is small since the dimensions of the polygon-fragment are smaller than a Nyquist pixel, in both axes. As such, it is reasonable to isolate the contribution during a backtransform with a buffer that is relatively narrow, e.g., k1=3. If, for example, the processing of the overhang is reduced from the full mask block G, e.g., $1024^2$ FT (corresponding to k1=205) used in the full block to a smaller patch of size G1, e.g., $64^2$ FT, the remaining portion (after the k1=3 buffer is removed) of the local rendering period in the spatial domain (subtile) will be about k1=6.8.

For each frequency in the $64^2$ FT, the m, nth element of the subtile transform (which is two-dimensional) is given by applying the equation below to each corner of the polygon fragment.

$$\Delta a(m,n;x,y)=e^{(2\pi i(m^*x/p))}*e^{(2\pi i(n^*y/p))} \quad (1),$$

where p is the physical width of the subtile, which will be smaller than the width of the full Nyquist bitmap by a ratio of G1/G; x and y denote the coordinates of the corner; and $\Delta a(m,n; x,y)$ is the contribution to the m, n diffraction order from the polygon fragment corner at the x, y axes. The equation (1) values are given alternating signs as the equation is applied to the four corners of the polygon fragment counterclockwise from the lower left. The results from all polygon fragments are then summed, and the result divided by the normalizing product $(m/(2^*\pi))^*(n/(2^*\pi))$. In the special case where either m or n is 0, the corresponding exponential term in equation (1) is replaced by x or y, respectively, and the corresponding term in the normalizing product is set to 1.

Once all the polygon-fragments in a respective patch region (subtile), e.g., $k1=6.8^2$ of the full $k1=205^2$ block have been Fourier transformed, the 2*NA bandlimit and backtransform processes can both be applied very rapidly (e.g., by using a $64^2$ FT).

Considering computational overhead, it is appropriate to carry out the Fourier transform and the backtransform calculation on the Nyquist grid, without subsampling. However, one can choose to improve the accuracy further by subsampling, using, e.g., an FFT for the subtile of size $R^2*64^2$, where R is the subsampling ratio, such as 2 or 4.

A 2-dimension list of subpixels surrounding the overhang portion may be determined using the following sub-Nyquist-sampled convolution equation:

$$g=\text{rect}_{subtile}(h \otimes p_f)\text{comb}_{subNyquist} \quad (2)$$

where g denotes a 2-dimension list of subpixels surrounding the overhang portion, h denotes a bandlimiting filter of the pseudo lens, $p_f$ denotes the overhang portion, and $\text{comb}_{subNyquist}$ represents an array of delta-functions on a subNyquist grid. In the case of no subsampling, the array is taken on the Nyquist grid.

Note that the truncation of the update patch to sizes substantially smaller than $64^2$ (radius of 32) will substantially degrade accuracy in this embodiment. This accuracy loss occurs in part because the truncation of the update patch causes its overall transmission to depart from that of the polygon fragment it represents. However, even when the rendition is re-normalized to have the correct transmission, it is found that the accuracy suffers greatly when the update radius is reduced to a small value, such as 2, even though such a small radius patch is far more efficient to calculate than a big patch with a radius of, e.g., 32.

According to an alternative embodiment, neighboring subpixel adjusting unit 134 adjusts the subpixels neighboring a polygon fragment by matching the moment of the polygon fragment with the moment of the adjustment. Comparing the previous embodiment, this embodiment is more suitable to use a patch that has a small radius, such as two subpixels. In this embodiment, the adjustment may be determined using the following method. When a partially covered pixel (or subpixel) at the edge of a polygon is rendered as a transmission-matched gray level, the center of gravity of the polygon's overhang, i.e., the part of the polygon covering the partially covered subpixels, is effectively shifted away from the polygon, because the gray-level fill is spread to the far edge of the pixel (or subpixel). This causes a small phase error in all diffraction orders other than the zeroth order. If one balances this shift by splitting the polygon-fragment's rendering between the overlapped subpixel and the inwardly-adjacent (neighboring) fully covered subpixel, e.g., by raising the transmission of the latter above 1 in some cases, and if the split is chosen in such a way as to preserve both the zero-order transmission and the polygon fragment's center of gravity, then, e.g., in the case of strong sub-sampling, the deviation from the original polygon fragment after bandlimiting will be reduced substantially.

More generally, allowing the term subpixel to cover the case of no subsampling, if h is used to denote the spatial response of the pseudo lens/bandlimiting function, e.g., 2*NA [or NA(1+σ)] kernel-support filter, and $p_d(x-x_0)$ is used to denote the rectangular tophat profile of a polygon-fragment that is centered at $x_0$ and has a width d (note that a 1D notation involving position coordinate x is adopted for simplicity), then the filtered representation of p using a Taylor expansion of h that converges rapidly in the limit of strong subsampling can be expanded using the following equation:

$$\int_{-\infty}^{\infty} dx' \, p_d(x-x_0) h(x-x') \cong \qquad (3)$$
$$\sum_{n=0}^{N} (-1)^n h^{(n)}(x) \frac{(x_0+d/2)^{n+1} - (x_0-d/2)^{n+1}}{(n+1)!},$$

where the infinite series is approximated using an N+1 term truncation, and the fact that $p_d$ is a tophat is used to carry out the integration.

The rendition of a particular polygon fragment may be determined by suitably adjusting the rendition of the neighboring subpixels of the patch. For example, a suitable adjustment is achieved by adjusting N+1 of the neighboring subpixels to match in the N+1 terms of the equation (3) expansion. The case N=1 corresponds to the simple example above of balancing the zero order and center of gravity. Letting a full subpixel have a width w and a position (r+1/2)w, with r an integer, and letting the width of the polygon-fragment be f*w, and setting the center point of a polygon fragment at $x_0$=f*w/2, the amplitude of adjustment ($a_r$) for the rth subpixel is determined by solving the set of simultaneous equations:

$$\sum_{r=r_{Min}}^{r_{Max}} a_r[(r+1)^{n+1} - r^{n+1}] = f^{n+1} \, \forall \, n \, | \, 0 \leq n \leq N, \qquad (4)$$

where N denotes the number of subpixels in the subpixel set to be adjusted minus 1, $r_{Max}$=N/2 and $r_{Min}$=−N/2 if N is even, $r_{Max}$=(N−1)/2 and $r_{Min}$=−(N+1)/2 if N is odd, $a_r$ denotes an amplitude adjustment for a subpixel r, and f denotes a ratio between an area covered by the overhang portion and an area covered by a subpixel.

Making the adjustment using equation set (4), the polygon fragment and its rendition match perfectly through the Nth moment when N+1 surrounding subpixels are adjusted. More generally, equation set (4) can be solved in a least squares sense if overdetermined, or in a minimum modulus sense if underdetermined. The solutions to equation set (4) are simple polynomials in f which may be evaluated very rapidly during OPC, for example, with N multipliers per polynomial in a simple implementation.

Equation set (4) is shown with a 1D notation involving position coordinate x regarding the adjustment for a 1D polygon-fragment, i.e., a polygon-fragment that fully covers the partially overlapped pixel in the y-axis but partially in the x-axis. With simple derivation, equation set (4) may be applied to calculate an adjustment for a 2D polygon-fragment, i.e., a polygon fragment that partially covers the overlapped pixel in both the x-axis and the y-axis. For example, when adjustments are made on five pixels that are centered on the partially overlapped pixel, the polynomials for the transmission adjustment are:

$$\frac{f_x f_y}{6} \begin{bmatrix} & (f_y^2 - 1) & \\ (2 - 3f_x + f_x^2) & (4 + 3[f_x + f_y] - 2[f_x^2 + f_y^2]) & (f_x^2 - 1) \\ & (2 - 3f_y + f_y^2) & \end{bmatrix}, \qquad (4')$$

where $f_x$ and $f_y$ represent the fractional polygon coverage in the x-axis and the y-axis.

In the above embodiment, as represented by equations/equation sets (3) and (4), it is preferable that the surrounding subpixels used to render a polygon fragment are small compared to the filter resolution of a bandlimiting function, e.g., the pseudo lens. According to an alternative embodiment, as described below, the specific shape of the bandlimiting function is also considered, which helps to ensure that a filtered rendition of the pixel-based imaging resembles the polygon fragment (and thus the initial mask design) as closely as possible. Specifically, the adjustment of neighboring subpixels are determined such that the interference produced by these adjustments against a differential change in the transmission of any one of the neighboring subpixels matches the interference produced by the polygon fragment against the same differential change in the transmission of that neighboring subpixel.

To ensure that a filtered rendition of the adjusted subpixels resembles the polygon fragment as closely as possible, an error needs to be minimized using the following equation:

$$\text{Error} = \int_{-\infty}^{\infty} dx \left| \int_{-\infty}^{\infty} dx' \, p_{fw}\left(x' - \frac{fw}{2}\right) h(x-x') - \sum_{r=r_{Min}}^{r_{Max}} a_r \int_{-\infty}^{\infty} dx'' \, p_w\left[x'' - \left(r + \frac{1}{2}\right)w\right] h(x-x'') \right|^2, \qquad (5)$$

where the integrated error throughout the image as a figure of merit is used as an example of the error, and a 1D notation is used for simplicity, and where b(x'−fw) represents an edge field positioned at an edge of a polygon, w denotes a width of a full subpixel, $p_w$ is a rectangular tophat profile of a subpixel, and $p_{fw}$ is the rectangular tophat of the overhang portion, h denotes a value of a bandlimiting filter of the pseudo lens, f denotes a ratio between an area covered by the overhang portion and an area covered by a subpixel r, b denotes a transmission of an edge field positioned at an edge of a polygon, and $a_r$ denotes an amplitude adjustment for subpixel r.

The cross-terms that result from expanding the integrated squared error in equation (5) can be simplified in a common way. Using ○ to denote the correlation operator, defined by $$[b \circ c](x) \equiv \int_{-\infty}^{\infty} dx' b(x') c*(x'+x),$$

the following general identity can be derived for the product terms that result when equation (5) is expanded:

$$\int_{-\infty}^{\infty}\int_{-\infty}^{\infty}\int_{-\infty}^{\infty} dx dx' dx'' p_A(x'-x_A)h(x-x')p_B^*(x''-x_B)h^*(x-x'') = \quad (5')$$
$$Q_{A,B}(x_B - x_A),$$
$$\text{where } Q_{A,B} \equiv (h \circ h) \circ (p_B \circ p_A) \quad (5'')$$

In most cases, h∘h=h. Usually there will be no ambiguity in suppressing the positional argument of Q.

Preferably, according to an embodiment, the required subpixel adjustments that minimize the error given in equation (5) can be determined approximately as the solutions to the following equation set:

$$\sum_{r'=r_{Min}}^{r_{Max}} a_{r'} \text{Re}(Q_{r',r''}) = \text{Re}(Q_{f,r''}) \forall r''|r_{Min} \le r'' \le r_{Max}, \quad (6)$$

where $a_{r'}$ denotes the rendition adjustment that must be applied to the r'th subpixel.

Figure 4:
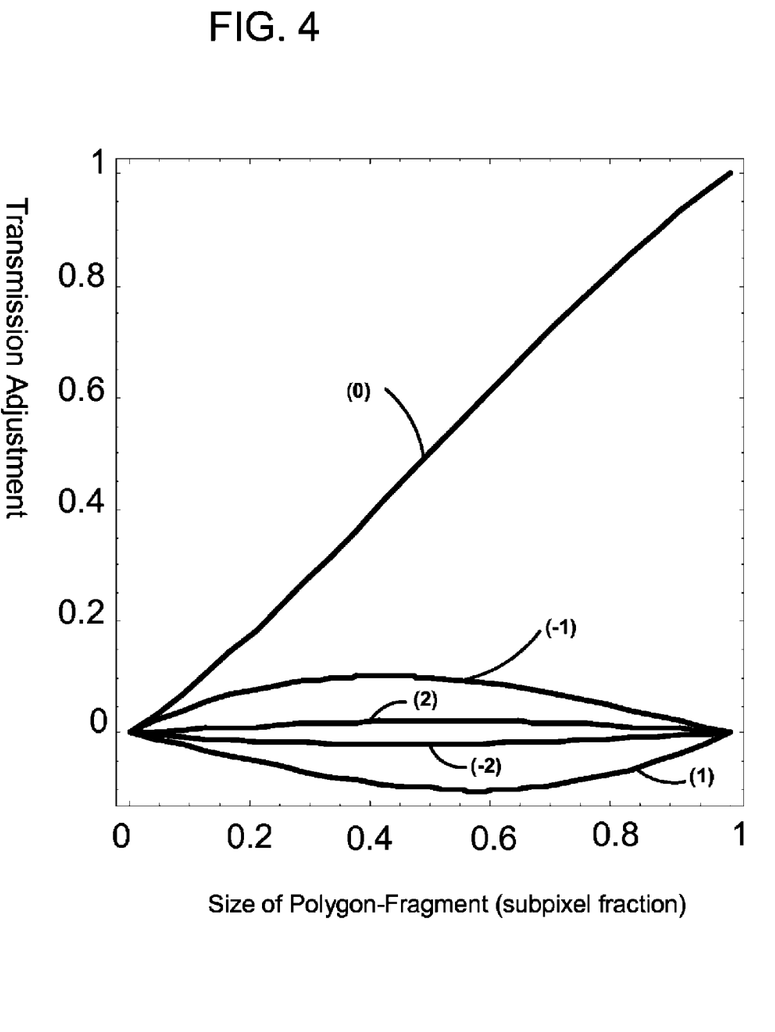
FIG. 4 shows an illustrative example of adjustments made on five neighboring subpixels.

FIG. 4 illustrates an example of transmission adjustments. The graph on FIG. 4 shows the transmission adjustment solutions for the case of an exemplary 5 pixel adjustment for a 1D edge adjustment (i.e., 2 pixels outside the partially covered pixel, the partially covered pixel, and 2 pixels inside the partially covered pixel) in the axis that the partially covered pixel is partially covered by the polygon fragment and 2× subsampling (which provides approximately four times faster rasterization than the 4× subsampling used in the current state-of-the-art method). The plotted results are for the correction of a 1D edge (with the corresponding sinc filter used for h), assuming a worst-case pupil fill (σ=1). In the plot of FIG. 4, curve −1 indicates the adjustments for the inside pixel (−1) immediately inside the partially covered pixel; curve −2 indicates the adjustment for the inside pixel next to pixel −1; curve 1 indicates the adjustment for the outside pixel (1) immediately outside the partially covered pixel; curve 2 indicates the adjustment for outside pixel (2) next to outside pixel (1); and curve 0 indicates the adjustment (if any) for the partially covered pixel (0). The polynomials of the adjusted transmissions of pixels −2 to 2 are used for the rendition of the polygon fragment.

It should be noted that it is not necessary to re-solve equations 6 for each overhang fragment on a mask that is rendered. In a preferred embodiment, one may instead first set up the rendering process by solving the equations for each of a number of possible values for the fractional subpixel coverage, and then use standard methods to fit interpolating functions, such as polynomials, to the solutions obtained for the $a_{r'}$ adjustments. For example, the curves in FIG. 4 can be fit by 4th degree polynomials in f that are accurate to within 2E-4.

After the interpolating functions are determined they are used when masks are rendered. More specifically, when processing overhang fragments on the mask one evaluates the interpolating functions to determine the proper subpixel adjustments, rather than re-solving equations 6 directly. The advantage of using interpolating functions in this way is that many interpolating functions, such as polynomials, can be evaluated far more rapidly than equations 6 can be solved. And, depending on the detailed hardware/software implementation, it may be efficient to take advantage of the fact that many polygon-fragments will have overhangs that are identical to those of their neighbors along the polygon edge at which they fall, eliminating the need to re-evaluate the polynomials for those neighboring overhangs.

According to another embodiment, neighboring subpixel adjusting unit 134 adjusts the subpixels using a table lookup. Under typical conditions, the table for each subpixel might contain a few hundred entries (after flattening), and in 2D patterns, five to twenty five subpixels may typically be employed in each adjustment patch. With specialized hardware it is then feasible to efficiently manage the memory access overhead associated with this relatively small number of relatively small tables.

Figure 5A:
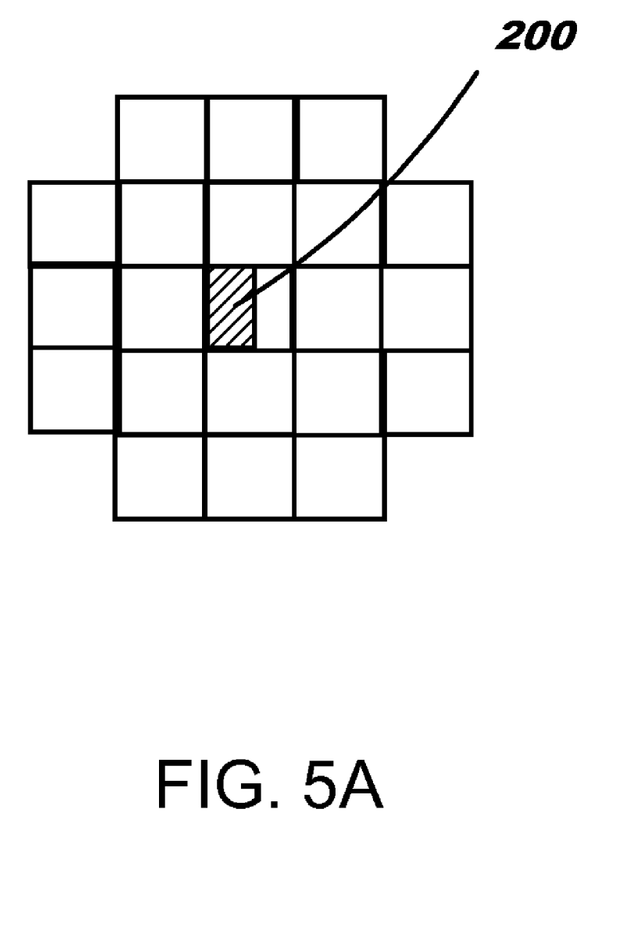
FIGS. 5A and 5B show two illustrative sets of subpixels used in rendering a polygon fragment.
Figure 5B:
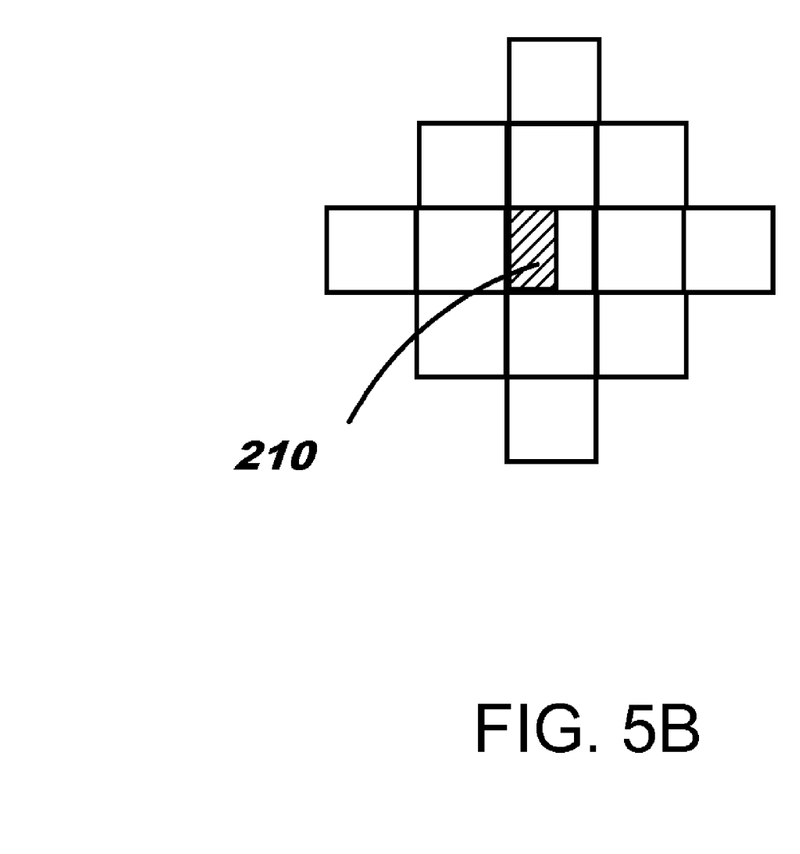
Figure 6:
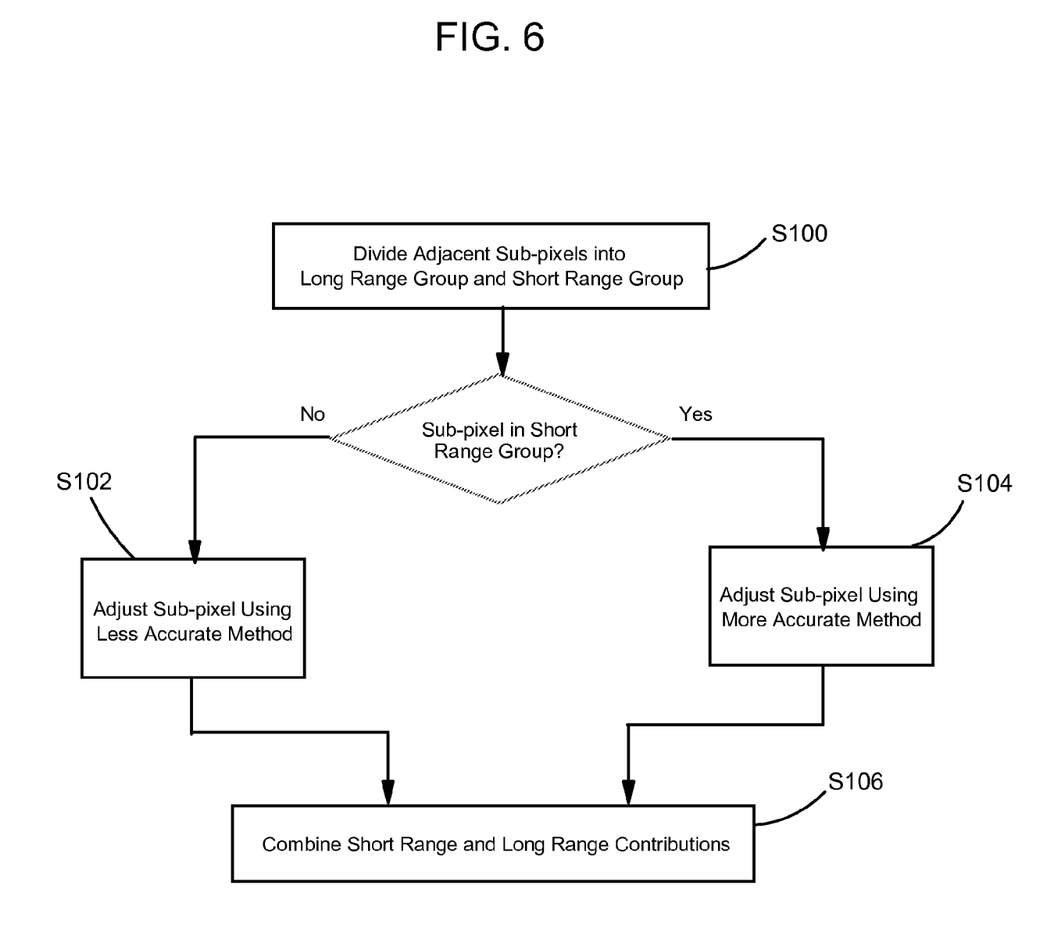
FIG. 6 shows details of a sub-process of the operational methodology of FIG. 3 according to an embodiment.

The number of neighboring subpixels (to a polygon fragment) to be adjusted may be determined by the rendition accuracy requirement. For example, for a highly accurate rendition of 2D patterns one might adjust an array of 21 subpixels neighboring polygon fragment 200 in a roughly circular arrangement, as illustrated in FIG. 5A, and it would usually be acceptable to reduce this to, e.g., 13 neighboring subpixels (FIG. 5B) neighboring polygon fragment 210 in order to reserve greatest accuracy for the Cartesian directions.

After the adjustment of neighboring subpixels, in subprocess S2-3, neighboring subpixel adjusting unit 134 updates the sub-Nyquist bitmap based on the adjusted subpixels, which result in an updated sub-Nyquist bitmap. It should be appreciated that it is not necessary that the adjusted patch (of the adjusted sub-Nyquist bitmap) for a polygon-fragment bears a physical resemblance to the polygon-fragment (in the initial mask design) in a pixel-based imaging application. Instead, the adjusted patch can depart arbitrarily from the polygon-fragment provided that the departures lie outside the bandwidth limit of a projection lens because the fundamental requirement for a balanced rendering of a polygon-fragment onto the coarse grid is that the convolution of the polygon-fragment with a bandlimited kernel (which would generally be somewhat broader in a full width at half maximum (FWHM) sense than the polygon-fragment) be closely matched by a convolution of this same kernel with the multi-subpixel rendition, i.e., the adjusted surrounding subpixels, of the polygon fragment. If this match is substantially close, the rendered mask and the physical mask are effectively equivalent as far as projection lens 18 (FIG. 1) is concerned.

Further improvements in accuracy are possible through exploitation of the spatially concentrated character of the polygon-fragment's rendition, which is largely maintained after effectively being bandlimited. Broadly speaking, the effectively bandlimited rendition resembles the impulse response of, e.g., the 2NA lens, since the polygon-fragments are fairly small. This means that the polygon-fragment's contribution to the bandlimited mask will largely be concentrated in the neighborhood of the polygon-fragment itself. It should be noted that the polygon-fragment lies on the margin of a mask polygon, and in most cases the desired edge contour of the printed image of this polygon will pass through the neighborhood in question. In an OPC application, the influence of the polygon-fragment on the printed feature is strongest in this same local section of the printed edge contour, i.e., short range. It is therefore desirable that the polygon-fragment's short-range contribution be calculated with particularly high accuracy. Conversely, stronger approximations in the rendition are justified for a subpixel at larger distance from the polygon fragment, i.e., long range.

As such, according to an embodiment, the subpixels of a patch are adjusted using different methods. FIG. 4 shows sub-process S2-2 of FIG. 3 in detail according to this embodiment. In S100, rendition accuracy selector 136 divides the neighboring subpixels into at least two groups based on a distance of a neighboring subpixel to the polygon fragment. The subpixels closer to the polygon fragment are categorized into a short range group as they reflect the short range contribution of the polygon fragment. The subpixels further away from the polygon fragment are categorized into a long range group. Any standard for dividing the subpixels into the two groups can be used and all are included. For example, the long-range and short-range contributions that each polygon-fragment makes to the bandlimited mask can be separated by dividing the, e.g., sinc or Airy effective filtering kernel into two parts.

A fast but less accurate method can be used to adjust the long range subpixels in S102 to represent the long-range contribution. The short range subpixels may be adjusted using a different (more accurate) algorithm in S104 to represent the short range contribution of the polygon fragment.

In S102, one way to accurately account for the polygon-fragment's short-range contributions is by simple table lookup. As noted above, the regularity of pixel-based image simulation lends itself to specialized computer hardware, and for sufficiently small regions such hardware can ease the memory latency problems that arise in the scenario of using a general-purpose computer.

If memory latency remains a concern, the rendition may be effectively filtered using the Fourier transform of a square that circumscribes the doubled circular pupil. This results in a sinc filter that is separable in x and y axes. The lookup table which applies to a single 1D axis is much smaller than a 2D Airy table, and when separability is exploited, only a small number of table entries along one axis (e.g., 17) need to be read in from memory. An outer product is then used to combine the entries to cover both axes, and the results may then be added to the working map of the bandlimited mask.

The long-range contributions should be captured using a kernel that is complementary to the short range kernel. Since the long-range kernel is weak, a more efficient algorithm may be used to calculate the contribution. An efficient way to do so is to simultaneously calculate the long-range contributions from all polygon-fragments as a group by means of the method described above in connection with equations (4)-(6).

In S106, combiner 138 blends the two kernel regions together in a gradual way across an overlap region such that the sum of the two contributions matches the full kernel. As such, the long range and short range contributions are merged.

A consideration here is that high frequencies will be generated when the Airy or sinc kernel is divided, but these can be minimized using a suitably smooth taper, analogous to a Hamming window. The residual high frequencies in the short-range contributions are automatically accounted for when the short-range tables are generated. The FFT for the long range contributions must be expanded to account for the complementary high frequency contributions, i.e., the FFT must be expanded somewhat to include the dominant part of a halo of high frequencies that are generated by the short-range/long-range division. This halo of high frequency content will then vanish after the long-range and short-range contributions are merged. Since the coarse mask rendition will typically be convolved with a large number of SOCS kernels during the calculation of the image, one may choose to filter and resample the merged mask at a spacing that is closer to the Nyquist limit of $0.25*\lambda/NA$.

In the above description, a coarse mask representation is described as reproducing the spatial frequencies that the physical mask would have if both were bandlimited. The physical mask is described, for the most part, as a two-dimensional transmission map formed from polygonal patterns which, for example, represent polygonal features in the circuit design. The simulation should preferably be carried out using polygonal features whose shapes include any OPC adjustments that will be used in the physical mask, and may also include non-printing assist features. In addition, the coarse mask representation needs to include a representation of the perturbations to the simple transmission-screen model that arise from the 3D topography of the physical mask. These so-called EMF effects can be accounted for using perturbational adjustments to the 2D thin-mask transmission map. In the case of a simple bias model of EMF effects, the positions of mask polygon edges are simply shifted in the 2D map to account for EMF. Such a biased 2D map can be used in the disclosure without making any change in the procedures described above.

However, EMF effects are more accurately represented by narrow boundary layer features that for simulation purposes are assumed to be positioned along all polygon edges (which may also be biased), and that each boundary layer is likely to be much narrower than a Nyquist pixel. The reciprocity between the boundary layer width and the transmission may not be accurately maintained when the boundary layer is expanded to dimensions as large as a Nyquist pixel (or even a subpixel at reasonable subsampling). As such, according to an embodiment, it is assumed that the boundary layer is given a fixed width that is small compared to the gridstep of the coarse subNyquist mask. The method for obtaining a coarse mask representation may be altered to accommodate such boundary layers, and this can be done based on the following considerations.

Note that a boundary layer is very similar in its properties to a polygon-fragment of a narrow width (and altered transmission), except that the boundary layer usually will not be aligned with the subNyquist grid along one edge. In other words, while 1D polygon-fragments have variable width but fixed position (flush with the inside edge of the associated subpixel), boundary layers will have fixed (narrow) width but variable position. One can then easily modify equations (5)-(6) to provide the appropriate rendering of the boundary layer onto the sub-Nyquist grid by making the corresponding change in the definition of $p_{fw}$.

As explained thus far, this procedure to include boundary layers would nominally entail an approximate doubling of the computational overhead involved in generating the rendered mask, since the boundary layers would essentially be treated as additional polygon fragments. However, the polygon-fragments and boundary layers are both associated with the same physical polygon edges, and it is possible to merge the two rendering computations into one because the variable that defines the required boundary layer rendition (namely the position of the boundary layer against the subpixel grid) is entirely determined by the variable that defines the rendition of the adjacent polygon-fragment (namely the overhang fraction of that polygon-fragment). As such, the renderings of the polygon-fragment and boundary layer can be combined by fitting the polynomials that provide the subpixel adjustments applied during lithographic simulations to the sum of the adjustment values calculated for each rendition (using overhang fraction as the single input variable). Alternatively this combination can be carried out directly in the equation (5) integrals.

Specifically, the term $$p_{fw}\left(x' - \frac{fw}{2}\right)$$

in equation (5) may be replaced by $$p_{fw}\left(x' - \frac{fw}{2}\right) + b(x' - fw),$$

where b(x'−fw) represents a boundary layer positioned at the edge of the polygon (i.e. one margin of the boundary layer is flush with the edge of the polygon fragment at position x=fw). Any scaling that might be used to convert the polygons to the generic case of unit transmission in an opaque background must also be applied to the boundary layer. Equations (5') and (5") for the cross-terms must similarly be updated to include the boundary layer along with the polygon fragment; this is done by substituting the above expression in place of $p_A$. The symbol $Q_{f+b,r''}$ may be used to designate the resulting Q factors that arise from equation (5") in this case. In general, the boundary layer is complex, so the adjustments $a_r$ will also be complex in general. The real and imaginary parts of these adjustments may be determined by solving separate sets of simultaneous equations:

$$\sum_{r'=r_{Min}}^{r_{Max}} \mathrm{Re}(a_{r'})\mathrm{Re}(Q_{r',r''}) = \mathrm{Re}(Q_{f+b,r''}) \forall\ r'' | r_{Min} \le r'' \le r_{Min}, \quad (6')$$

$$\sum_{r'=r_{Min}}^{r_{Max}} \mathrm{Im}(a_{r'})\mathrm{Re}(Q_{r',r''}) = -\mathrm{Im}(Q_{f+b,r''}) \forall\ r'' | r_{Min} \le r'' \le r_{Min}. \quad (6'')$$

where N denotes a number of the set of subpixels to be adjusted minus 1, $r_{Max}=N/2$ and $r_{Min}=-N/2$ if N is even, $r_{Max}=(N-1)/2$ and $r_{Min}=-(N+1)/2$ if N is odd, r' and r" denote two subpixels, f denotes a ratio between an area covered by the overhang portion and an area covered by a subpixel r, b denotes a transmission of an edge field (boundary layer) positioned at an edge of a polygon, $\mathrm{Re}(a_r)$ represents a real part of the adjustment $a_r$, $\mathrm{Im}(a_r)$ represents an imaginary part of the adjustment $a_r$, and $a_r$ denotes an amplitude adjustment for subpixel r, and the Q factor is determined by equations (5') and (5"). Usually each Q factor will be a real number when b=0 (i.e., a boundary layer is not included), and when Q is real, equation (6") shows that $\mathrm{Im}(a_r)=0$ and $a_r=\mathrm{Re}(a_r)$, making equation (6') equivalent to equation (6). However, b will usually be complex when a boundary layer or a DDM field (referred together as edge field as described herein) is present, making Q and $a_r$ variable also.

This process can be extended to calculation of a single polynomial that represents the total adjustment that must be applied (to a particular subpixel in a patch) to account for the combined effect of multiple adjacent boundary layer strips in addition to the polygon-fragment, which may be referred together as an overhang portion. Such a fine subdivision of the boundary perturbation into what is effectively a varying field profile rather than a single boundary layer is known as the Domain Decomposition Method (DDM). For this reason, the boundary layer can be understood as an example of a DDM field. As such, a boundary layer and a DDM field is referred to together as an edge field in the description. The method therefore allows the inclusion of either a DDM field or a boundary layer without increasing execution time (beyond a possible factor of 2 that may be needed to account for mixed illumination polarizations). Again, this inclusion can alternatively be accomplished by including the DDM fields in the equation 5 integrals. In this way, additional boundary layer features or DDM fields are included without increasing execution time because the polynomials which provide the rendering of polygon fragments simultaneously provide the rendering of the boundary layer or DDM field.

IV. CONCLUSION

As discussed herein, various systems and components are described as "obtaining" data (e.g., obtainer 130, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for rendering a mask, it is understood that the disclosure further provides various alternative embodiments. For example, in an embodiment, the disclosure provides a program product stored on a computer-readable medium, which when executed, enables a computer infrastructure to control rendering a mask. To this extent, the computer-readable medium includes program code, such as mask rendering system 106 (FIG. 2), which implements the process described herein. It is understood that the term "computer-readable medium" comprises one or more of any type of tangible medium of expression (e.g., physical embodiment) of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 (FIG. 2) and/or storage system 122 (FIG. 2) (e.g., a fixed disk, a read-only memory, a random access memory, a cache memory, etc.), as a data signal traveling over a network (e.g., during a wired/wireless electronic distribution of the program product), on paper (e.g., capable of being scanned in as electronic data), and/or the like.

In another embodiment, the disclosure provides a method of generating a system for rendering a mask. In this case, a computer infrastructure, such as computer infrastructure 102 (FIG. 2), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of rendering a mask, the method comprising:
providing an initial mask design for a photolithographic process, the initial mask design including polygons;
initially rendering the initial mask design as a coarse mask representation in a pixel based image calculation using a computer;
identifying an overhang portion using the computer;
rendering the overhang portion using a set of subpixels whose artifacts from spatial-localization lie outside a practical resolution of a pseudo lens having a numerical aperture larger than that of a projection lens used in the photolithographic process using the computer; and
updating the initial rendering based on the overhang portion rendering using the computer.

2. The method of claim 1, wherein the pseudo lens has a numeral aperture approximately (1+σ) times the numerical aperture of the projection lens, σ denoting a directional range of an illumination in the photolithographic process.

3. The method of claim 1, wherein the set of subpixels are positioned about the overhang portion with a diameter of approximately at least two subpixels.

4. The method of claim 1, wherein the overhang portion rendering includes:
adjusting the set of subpixels; and
updating the pixel-based image calculation based on the adjusted set of subpixels.

5. The method of claim 4, wherein the adjusting is implemented by performing an analytic Fourier transform and a back transform with a buffer on the set of subpixels.

6. The method of claim 5, wherein the set of subpixels are determined approximately using equation:

$$g = \text{rect}_{subtile}(h\ddot{A}p_f)\text{comb}_{subNyquist},$$

where g denotes a 2-dimension list of subpixels surrounding the overhang portion, h denotes a value of a bandlimiting filter of the pseudo lens, $p_f$ denotes the overhang portion, and $\text{comb}_{subNyquist}$ represents an array of delta-functions on a subNyquist grid.

7. The method of claim 4, wherein the adjusting is determined based on a polynomial fit.

8. The method of claim 4, wherein the adjusting is determined by matching a moment of the overhang portion with a moment of the adjustment.

9. The method of claim 8, wherein the adjusting is determined by splitting the rendering of the overhang portion between a partially covered subpixel and an inwardly-adjacent fully covered subpixel.

10. The method of claim 8, wherein the adjusting is determined approximately using equations:

$$\sum_{r=r_{Min}}^{r_{Max}} a_r[(r+1)^{n+1} - r^{n+1}] = f^{n+1} \, \forall \, n | 0 \le n \le N,$$

where N denotes a number of subpixels in the subpixel set to be adjusted minus 1, $r_{Max}=N/2$ and $r_{Min}=-N/2$ if N is even, or $r_{Max}=(N-1)/2$ and $r_{Min}=-(N+1)/2$ if N is odd, $a_r$ denotes an amplitude adjustment for a subpixel r, and f denotes a ratio between an area covered by the overhang portion and an area covered by a subpixel.

11. The method of claim 4, wherein the adjusting is determined by matching an interference produced by the adjustment against a differential change in an transmission of one of the set of subpixels to an interference produced by the overhang portion against the same differential change in the transmission of the subpixel.

12. The method of claim 11, wherein the adjusting is determined approximately by minimizing an error defined by equation:

$$\text{Error} = \int_{-\infty}^{\infty} dx \left| \int_{-\infty}^{\infty} dx' \left[ p_{fw}\left(x' - \frac{fw}{2}\right) + b(x' - fw) \right] h(x - x') - \sum_{r=r_{Min}}^{r_{Max}} a_r \int_{-\infty}^{\infty} dx'' p_w \left[x'' - \left(r + \frac{1}{2}\right)w\right] h(x - x'') \right|^2,$$

where b(x'−fw) represents an edge field positioned at an edge of a polygon, w denotes a width of a full subpixel, $p_w$ is a rectangular tophat profile of a subpixel, and $p_{fw}$ is the rectangular tophat of the overhang portion, h denotes a value of a bandlimiting filter of the pseudo lens, f denotes a ratio between an area covered by the overhang portion and an area covered by a subpixel r, b denotes a transmission of an edge field positioned at an edge of a polygon, and $a_r$ denotes an amplitude adjustment for subpixel r.

13. The method of claim 4, wherein the adjusting is determined using a table lookup.

14. The method of claim 4, further comprising dividing the set of subpixels into at least two groups based on a distance of a subpixel to the overhang portion, the two groups of subpixels being adjusted using different methods of different accuracies.

15. A system for rendering a mask, the system comprising:
a computer configured to perform the method comprising:
receiving an initial mask design for a photolithographic process, the initial mask design including polygons;
initially rendering the initial mask design as a coarse mask representation in a pixel based image calculation;
identifying an overhang portion;
rendering the overhang portion using a set of subpixels whose artifacts from spatial-localization lie outside a practical resolution of a pseudo lens having a numerical aperture larger than that of a projection lens used in the photolithographic process; and updating the initial rendering based on the overhang portion rendering.

16. The system of claim 15, wherein the pseudo lens has a numeral aperture approximately (1+σ) times the numerical aperture of the projection lens, σ denoting a directional range of an illumination in the photolithographic process.

17. The system of claim 15, wherein the overhang portion rendering:
adjusts the set of subpixels; and
updates the pixel-based image calculation based on the adjusted set of subpixels.

18. The system of claim 17, wherein the overhang portion rendering determines the adjusting by matching a moment of the overhang portion with a moment of the adjustment.

19. The system of claim 18, wherein the overhang portion rendering determines the adjusting by splitting the rendering of theoverhang portion between a partially covered subpixel and an inwardly-adjacent fully covered subpixel.

20. The system of claim 18, wherein the overhang portion rendering determines the adjusting by matching an interference produced by the adjustment against a differential change in an transmission of one of the set of subpixels to an interference produced by the overhang portion against the same differential change in the transmission of the subpixel.

21. A computer program product for rendering a mask, comprising computer usable program code embodied on a non-transitory computer readable medium which, when executed by a computer system, enables the computer system to:
receive an initial mask design for a photolithographic process, the initial mask design including polygons;
initially render the initial mask design as a coarse mask representation in a pixel based image calculation;
identify an overhang portion;
render the overhang portion using a set of subpixels whose artifacts from spatial-localization lie outside a practical resolution of a pseudo lens having a numerical aperture larger than that of a projection lens used in the photolithographic process; and
update the initial rendering based on the overhang portion rendering.

22. The program product of claim 21, wherein the program code is configured to enable the computer system to:
adjust the set of subpixels; and
update the pixel-based image calculation based on the adjusted set of subpixels.

23. The program product of claim 22, wherein the program code is configured to enable the computer system to determine the adjusting by matching a moment of the overhang portion with a moment of the adjustment.

24. The program product of claim 22, wherein the program code is configured to enable the computer system to determine the adjusting by matching an interference produced by the adjustment against a differential change in an transmission of one of the set of subpixels to an interference produced by the overhang portion against the same differential change in the transmission of the subpixel.

25. A method of providing a system for rendering a mask, the method comprising:
a computer infrastructure operable to:
receive an initial mask design for a photolithographic process, the initial mask design including polygons;
initially render the initial mask design as a coarse mask representation in a pixel based image calculation;
identify an overhang portion;
render the overhang portion using a set of subpixels whose artifacts from spatial-localization lie outside a practical resolution of a pseudo lens having a numerical aperture larger than that of a projection lens used in the photolithographic process; and
update the initial rendering based on the overhang portion rendering.

* * * * *